(12) United States Patent
Yu et al.

(10) Patent No.: US 10,269,732 B2
(45) Date of Patent: Apr. 23, 2019

(54) INFO PACKAGE WITH INTEGRATED ANTENNAS OR INDUCTORS

(71) Applicant: Taiwan Semiconductor Manufacturing Company, Ltd., Hsin-Chu (TW)

(72) Inventors: Chen-Hua Yu, Hsin-Chu (TW); Chuei-Tang Wang, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/283,604

(22) Filed: Oct. 3, 2016

(65) Prior Publication Data
US 2018/0025999 A1    Jan. 25, 2018

Related U.S. Application Data

(60) Provisional application No. 62/364,546, filed on Jul. 20, 2016.

(51) Int. Cl.
| | |
|---|---|
| H01L 27/14 | (2006.01) |
| H01L 23/66 | (2006.01) |
| H01L 23/31 | (2006.01) |
| H01L 23/485 | (2006.01) |
| H01L 23/64 | (2006.01) |

(52) U.S. Cl.
CPC .......... *H01L 23/66* (2013.01); *H01L 23/3114* (2013.01); *H01L 23/485* (2013.01); *H01L 23/645* (2013.01); *H01L 2223/6677* (2013.01); *H01L 2224/04105* (2013.01); *H01L 2224/12105* (2013.01); *H01L 2224/18* (2013.01); *H01L 2224/24195* (2013.01); *H01L 2224/48091* (2013.01); *H01L 2224/73267* (2013.01); *H01L 2224/97* (2013.01); *H01L 2924/15311* (2013.01); *H01L 2924/181* (2013.01); *H01L 2924/19042* (2013.01); *H01L 2924/19105* (2013.01)

(58) Field of Classification Search
CPC ... H01L 23/66; H01L 23/645; H01L 23/3114; H01L 23/485; H01L 2223/6677
See application file for complete search history.

(56) References Cited

U.S. PATENT DOCUMENTS

| | | | |
|---|---|---|---|
| 7,119,745 B2 * | 10/2006 | Gaucher | H01Q 9/26 343/700 MS |
| 7,372,408 B2 * | 5/2008 | Gaucher | H01Q 1/2283 343/700 MS |
| 7,564,115 B2 | 7/2009 | Chen et al. | |
| 7,633,165 B2 | 12/2009 | Hsu et al. | |
| 7,825,024 B2 | 11/2010 | Lin et al. | |
| 7,955,942 B2 * | 6/2011 | Pagaila | H01L 23/49822 257/531 |
| 7,973,413 B2 | 7/2011 | Kuo et al. | |
| 8,105,875 B1 | 1/2012 | Hu et al. | |

(Continued)

*Primary Examiner* — Ismail A Muse
(74) *Attorney, Agent, or Firm* — Slater Matsil, LLP

(57) ABSTRACT

In some embodiments, a semiconductor package includes a die surrounded by a molding material, a redistribution layer over the die and the molding material, the redistribution layer electrically coupled to the die, and a first conductive structure in the molding material and electrically coupled to the die, the first conductive structure being an inductor or an antenna.

21 Claims, 25 Drawing Sheets

(56) References Cited

U.S. PATENT DOCUMENTS

| | | | |
|---|---|---|---|
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |
| 8,426,961 B2 | 4/2013 | Shih et al. | |
| 8,669,174 B2 | 3/2014 | Wu et al. | |
| 8,779,564 B1* | 7/2014 | Knudsen | H01L 24/19 257/660 |
| 8,802,504 B1 | 8/2014 | Hou et al. | |
| 8,803,292 B2 | 8/2014 | Chen et al. | |
| 8,803,316 B2 | 8/2014 | Lin et al. | |
| 2005/0093669 A1* | 5/2005 | Ahn | H01F 5/003 336/200 |
| 2006/0131959 A1* | 6/2006 | Nishijima | B60R 25/04 307/10.5 |
| 2008/0135977 A1* | 6/2008 | Meyer | H01L 24/82 257/531 |
| 2008/0149381 A1* | 6/2008 | Kawagishi | H05K 1/187 174/261 |
| 2008/0259585 A1* | 10/2008 | Fujii | H05K 9/0056 361/812 |
| 2009/0051025 A1* | 2/2009 | Yang | H01L 21/561 257/690 |
| 2012/0168963 A1* | 7/2012 | Huang | H01L 23/50 257/774 |
| 2013/0001795 A1* | 1/2013 | Lim | H01L 23/481 257/774 |
| 2014/0001645 A1 | 1/2014 | Lin et al. | |
| 2014/0110841 A1* | 4/2014 | Beer | H01L 23/49822 257/738 |
| 2014/0152509 A1* | 6/2014 | Liu | H01Q 9/0407 343/700 MS |
| 2014/0225258 A1 | 8/2014 | Chiu et al. | |
| 2014/0252572 A1 | 9/2014 | Hou et al. | |
| 2015/0171013 A1* | 6/2015 | Liao | H01L 23/3114 257/691 |
| 2015/0171033 A1* | 6/2015 | Seler | H01L 23/66 257/664 |
| 2016/0111364 A1* | 4/2016 | Liao | H01L 23/3114 257/531 |
| 2016/0247780 A1* | 8/2016 | Seler | H01L 23/66 |
| 2016/0358897 A1* | 12/2016 | Albers | H01L 25/50 |
| 2017/0213800 A1* | 7/2017 | Seler | H01L 23/66 |
| 2017/0221838 A1* | 8/2017 | Chen | H01L 23/66 |
| 2017/0237167 A1* | 8/2017 | Ohno | H01Q 9/40 343/715 |

* cited by examiner

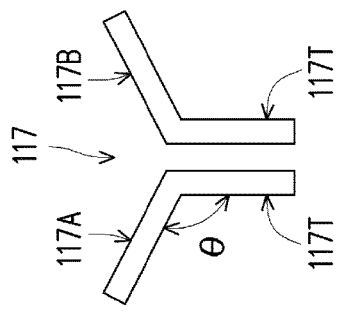
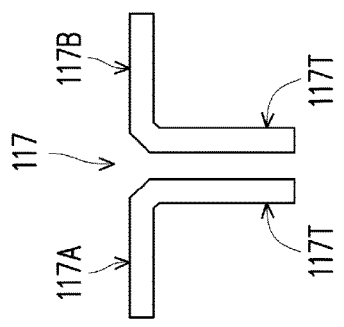
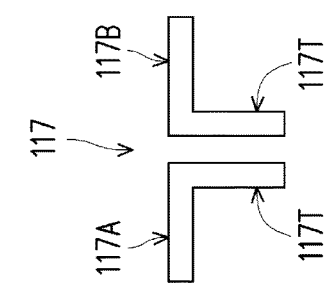
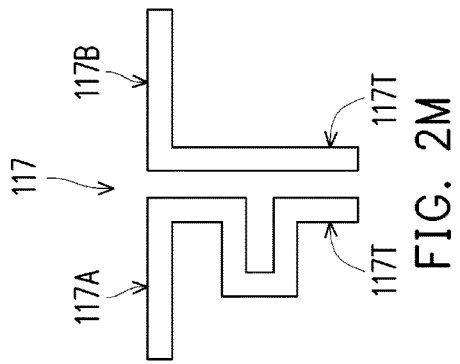
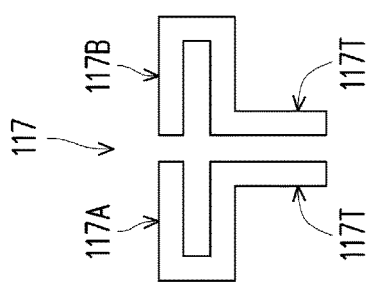

INFO PACKAGE WITH INTEGRATED ANTENNAS OR INDUCTORS

PRIORITY CLAIM AND CROSS-REFERENCE

This application claims priority to U.S. Provisional Patent Application No. 62/364,546, filed on Jul. 20, 2016, entitled "InFO Package with Integrated Antennas or Inductors," which application is hereby incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2M, and 2O-2T illustrate cross-sectional views of intermediate steps during a process for forming the semiconductor package illustrated in FIGS. 1A through 1D, in accordance with some embodiments.

DETAILED DESCRIPTION

Figure 1A:
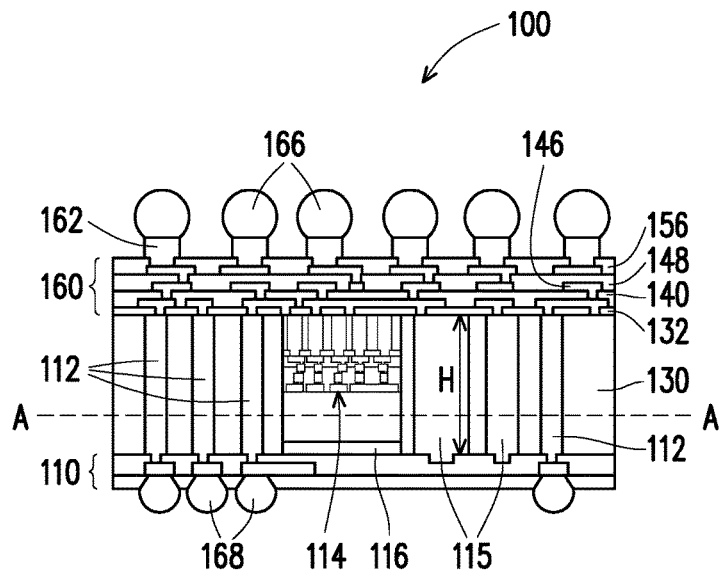
FIGS. 1A through 1D illustrate cross-sectional views of a semiconductor package, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a semiconductor package structure including antennas and/or inductors that are formed in the molding material of the semiconductor package. The antennas and inductors may be formed using the same material and at the same time as the vias extending through the molding material. By integrating antennas and/or inductors in the molding compound of the semiconductor package, smaller form factors are achieved. The shorter electrical connection between the antenna and the die of the semiconductor package may provide enhanced performance for the antenna, due to, e.g., less transmission loss.

FIG. 1A illustrates a cross-sectional view of a semiconductor package 100, in accordance with some embodiments. As illustrated by FIG. 1A, the semiconductor package 100 includes a semiconductor die 114 (also referred to as die 114, integrated circuit (IC) die 114, or chip 114) attached to a back-side redistribution structure 110 (also referred to as back-side redistribution layer 110) by an adhesive 116. The back-side redistribution structure 110 may include one or more dielectric layers with conductive features (e.g., conductive lines and vias) formed therein. A plurality of external connectors 168 are attached and electrically coupled to the back-side redistribution structure 110. The die 114 is surrounded by a molding compound 130. A front-side redistribution structure 160 (also referred to as front-side redistribution layer 160) is formed over the die 114 and the molding compound 130. The front-side redistribution structure 160 includes a plurality of dielectric layers 132/140/148/156 and conductive features (e.g., conductive patterns 146) formed therein. External connectors 166 are attached and electrically coupled to the front-side redistribution structure 160, e.g., via under bump metallurgies (UBMs) 162. The front-side redistribution layer 160 and/or the back-side redistribution layer 110 extend beyond the boundary of the die 114, thereby enabling the fan-out of die 114 and allowing connection with other packages or components in areas outside the boundary of die 114. Therefore, package 100 is also referred to as an integrated fan-out (InFO) package. Although FIG. 1A illustrates one die 114 as an example, skilled artisans will appreciate that other numbers of dies, e.g., more than one dies 114, may be included in package 100. Similarly, more than one dies 114 may be included in other embodiments (e.g., FIGS. 3A-3C, 4A-4C, 5A-5C and 6) of the present disclosure.

As illustrated in FIG. 1A, a plurality of vias 112 is disposed adjacent to the die 114, and extends through the molding compound 130. Vias 112 are coupled to the front-side redistribution structure 160 and/or the back-side redistribution structure 110, in some embodiments.

Still referring to FIG. 1A, an inductor 115 is formed in the molding compound 130 adjacent to the die 114. The inductor 115 is formed using a conductive material, e.g., the same electrically conductive material used in forming vias 112. The inductor 115 has a height H, which may be substantially the same as the height of the molding compound 130. In other embodiments, the height H of inductor 115 may be smaller than the height of the molding compound 130.

Figure 1B:
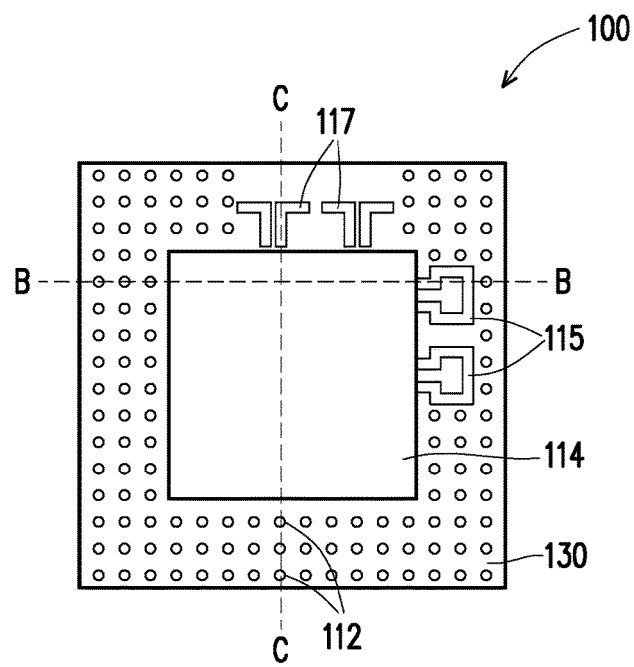

FIG. 1B illustrates the cross-sectional view of the package 100 along line A-A in FIG. 1A, e.g., a top view of package 100 along line A-A in FIG. 1A. FIG. 1B shows die 114, vias 112, a plurality of inductors 115, and a plurality of antennas 117 embedded in the molding compound 130. FIG. 1A corresponds to the cross-sectional view of package 100 along line B-B of FIG. 1B, and FIG. 1C corresponds to the cross-sectional view of package 100 along line C-C of FIG. 1B. Therefore, antenna 117 is not visible in FIG. 1A, but is shown in FIG. 1C.

FIG. 1B illustrates two antennas 117, and each of the two antennas 117 includes two L-shaped conductive walls that are closely spaced apart, with the molding compound 130 filling a gap between the two conductive walls. FIG. 1B also illustrates two inductors 115, and each of the inductors 115 includes a partially enclosed conductive wall surrounding a portion of the molding compound 130. Although FIG. 1B shows two inductors 115 and two antennas 117 in the molding compound 130, skilled artisan will appreciate that any number of inductors and any number of antennas (e.g., one, or more than two) may be formed in the molding compound 130. In addition, the shape of the inductors 115 and the shape of the antennas 117 may include other suitable shapes. For example, FIGS. 2D-2G illustrate various shapes for the inductors 115, and FIGS. 2I-2M illustrate various shapes for the antenna 117.

Figure 1C:
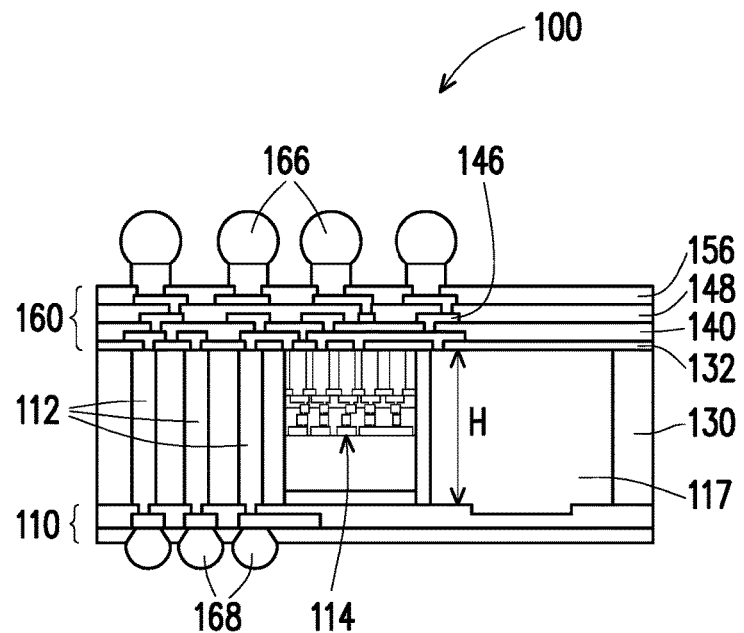

FIG. 1C illustrates the cross-sectional view of the package 100 along line C-C in FIG. 1B. A segment (see FIG. 1B) of the L-shaped conductive wall of antenna 117 is shown in FIG. 1C. The conductive walls of antenna 117 may be formed using the same material used for forming vias 112, and a height H of the conductive walls of antennas 117 may be substantially the same as the height of the molding compound 130, although height H may comprise other dimensions (e.g., smaller than the height of molding compound 130). As illustrated in FIGS. 1A and 1C, the inductors 115 and/or the antennas 117 are electrically coupled to the die 114 via the front-side redistribution layer 160, although it is possible to electrically couple the inductors 115 and/or the antennas 117 to die 114 via other means, e.g., via the back-side redistribution layer 110 (not shown). The inductors 115 and/or the antennas 117 may also be electrically coupled to external connectors (e.g., 166 and/or 168), thus enabling connection of the inductors 115 and/or the antennas 117 with other packages or components. For example, another package which does not have an antenna may be connected to package 100 via connectors 168, thus having access to (e.g., being able to use) antenna 117 of package 100.

Figure 1D:
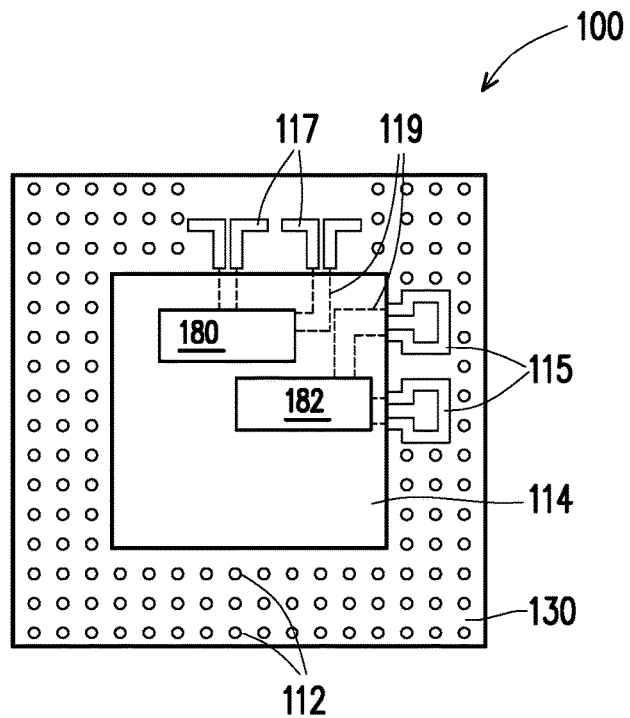

FIG. 1D illustrates the electrical connections between inductors 115/antennas 117 and die 114 in a top view similar to the top view of FIG. 1B. Note that electrical connections 119 (e.g., conductive paths 119) are shown in phantom, since the conductive paths 119 may include electrical paths in, e.g., the front-side redistribution layer 160, thus conductive paths 119 may not be in the plane illustrated in the cross-sectional view of FIG. 1D. As illustrated in FIG. 1D, one or more antennas 117 are electrically coupled to circuit 180 of the die 114. Circuit 180 may be or include an RF circuit (also referred as an RF module) of the semiconductor die 114, which RF circuit may interface with one or more antennas 117 for transmitting and/or receiving electromagnetic signals, such as radio frequency (RF) signals. FIG. 1D also shows one or more inductors 115 electrically coupled to circuit 182 of the semiconductor die 114. Circuit 182 may be or include any circuit that includes or interfaces with an inductor. Examples of circuit 182 include a voltage-controlled oscillator (VCO) circuit, a low-noise amplifier (LNA) circuit, or a voltage regulator circuit.

Figure 2A:
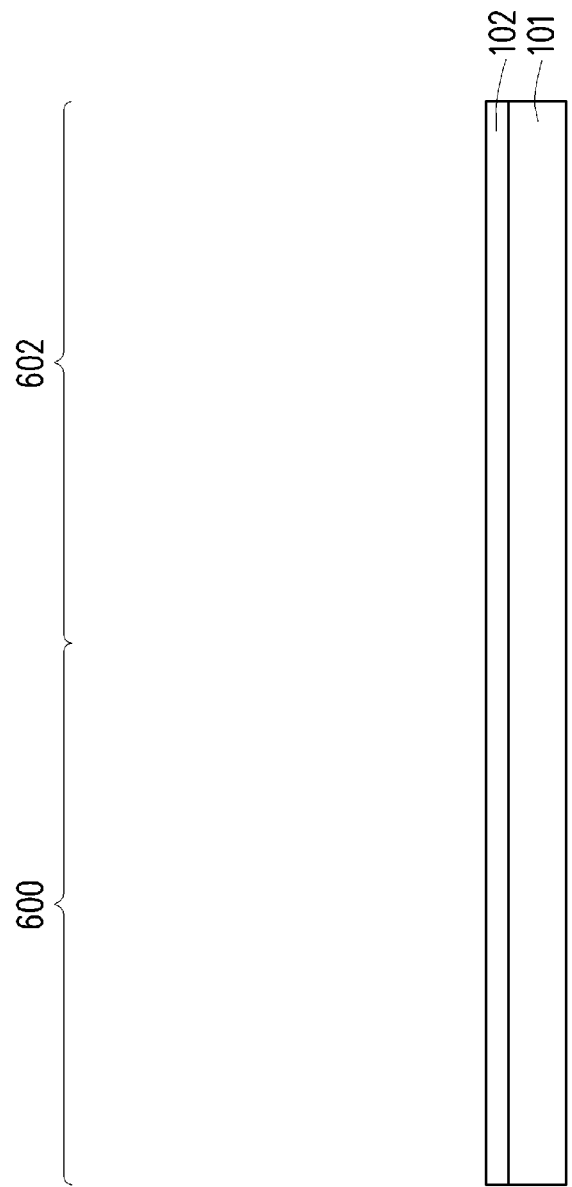

FIGS. 2A-2M and 2O-2T illustrate cross-sectional views of the semiconductor package 100 shown in FIGS. 1A-1D at various stages of fabrication, in accordance with some embodiments. Unless otherwise specified, FIGS. 2A-2M and 2O-2T correspond to cross-sectional views along line B-B in FIG. 1B. FIG. 2A illustrates a carrier substrate 101 and a release layer 102 formed on the carrier substrate 101. A first package region 600 and a second package region 602 for the formation of a first package and a second package, respectively, are illustrated.

The carrier substrate 101 may be a glass carrier substrate, a ceramic carrier substrate, or the like. The carrier substrate 101 may be a wafer, such that multiple packages can be formed on the carrier substrate 101 simultaneously. The release layer 102 may be formed of a polymer-based material, which may be removed along with the carrier substrate 101 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 101, or may be the like. The top surface of the release layer 102 may be leveled and may have a high degree of coplanarity.

Figure 2B:

In FIG. 2B, a dielectric layer 104 and a metallization pattern 106 are formed. As illustrated in FIG. 2B, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG); or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

Figure 2C:
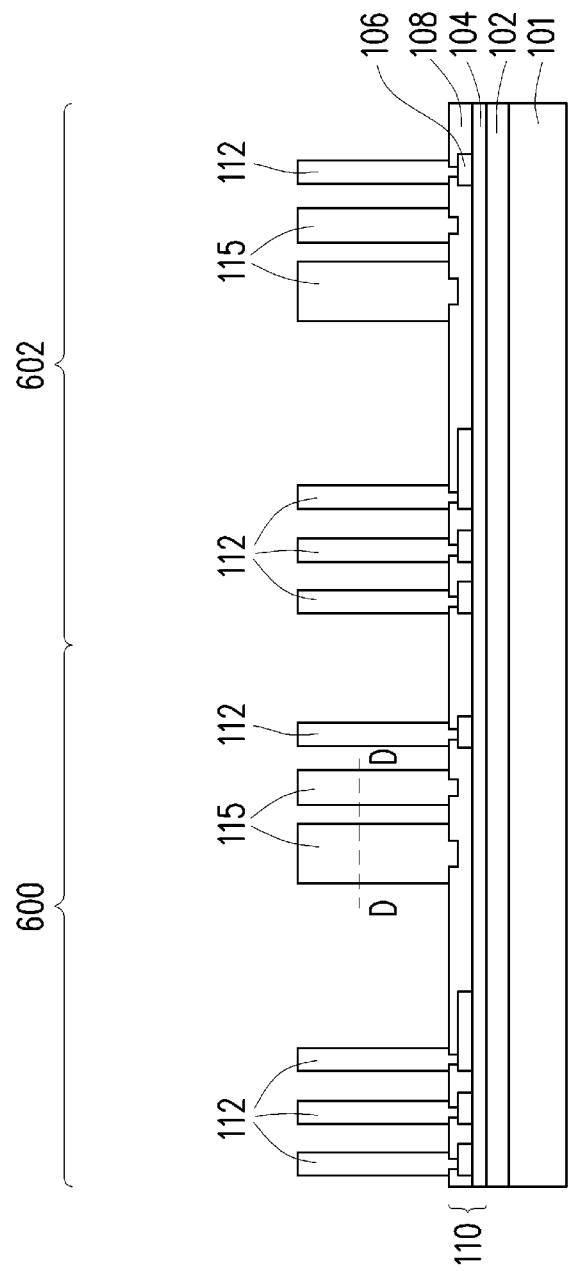

In FIG. 2C, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure 110. As illustrated, the back-side redistribution structure 110 includes the two dielectric layers 104 and 108 and one metallization pattern 106. In other embodiments, the back-side redistribution structure 110 can include any number of dielectric layers, metallization patterns, and vias. One or more additional metallization pattern and dielectric layer may be formed in the back-side redistribution structure 110 by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns.

Further in FIG. 2C, through vias 112 (also referred to as vias 112) are formed. As an example to form the through vias 112, a seed layer is formed over the back-side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

As shown in FIG. 2C, inductors 115 are formed. The inductors 115 may be formed at the same time and using the same material as the vias 112, in some embodiments. The same processing steps used for forming vias 112 discussed above may be used to form the inductors 115, with the pattern of the photo resist adjusted to create a desired pattern for the inductors 115 at locations where the inductors 115 are to be formed. In other embodiments, the inductors 115 may be formed using a different process than the process used to form the vias 112, and therefore, may be formed using a different material and/or at a different time than the vias 112.

Figure 2E:
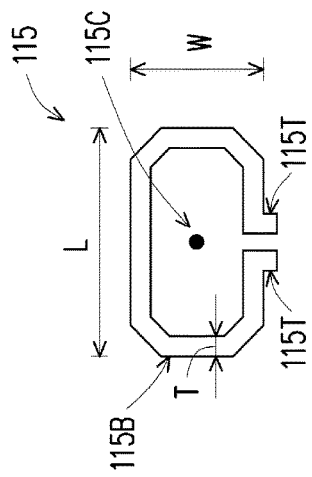
Figure 2G:
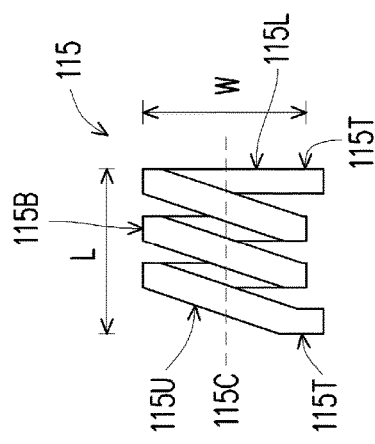
Figure 2H:
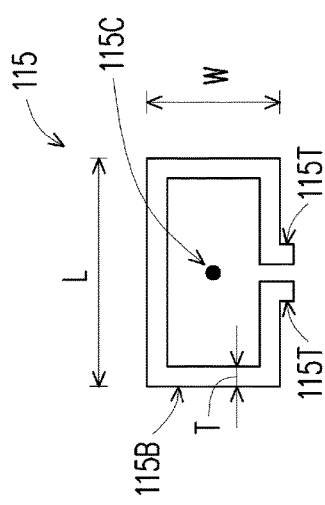
Figure 2F:
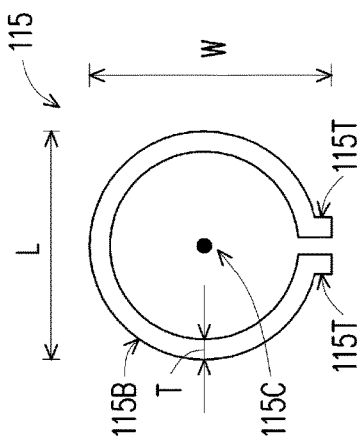
Figure 2H:
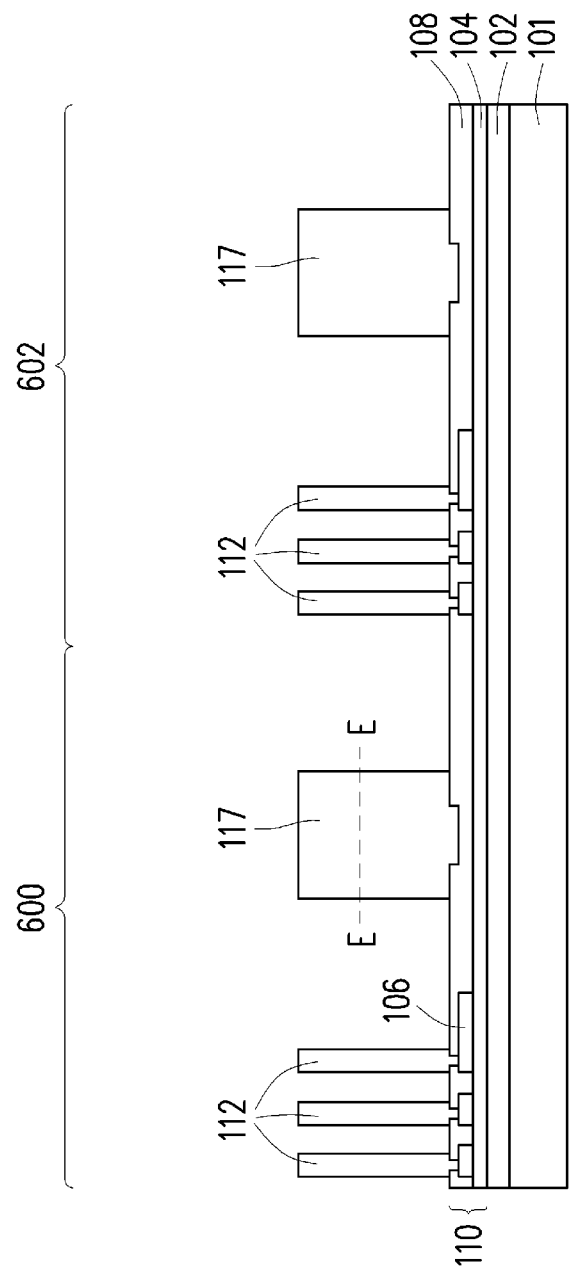
Figure 2N:
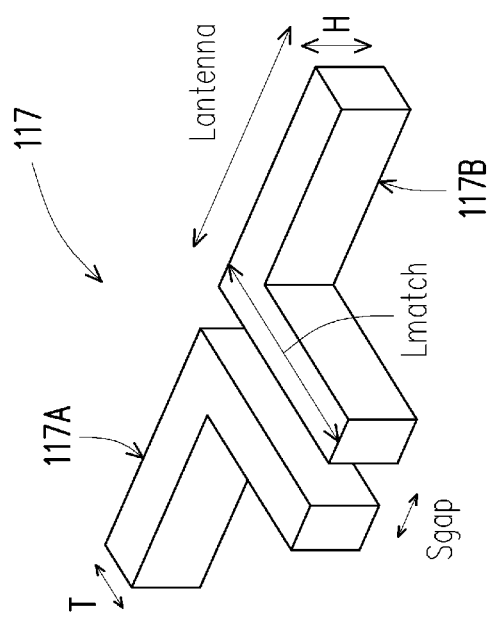
FIG. 2N illustrates a perspective view of an antenna, in some embodiments.
Figure 20:
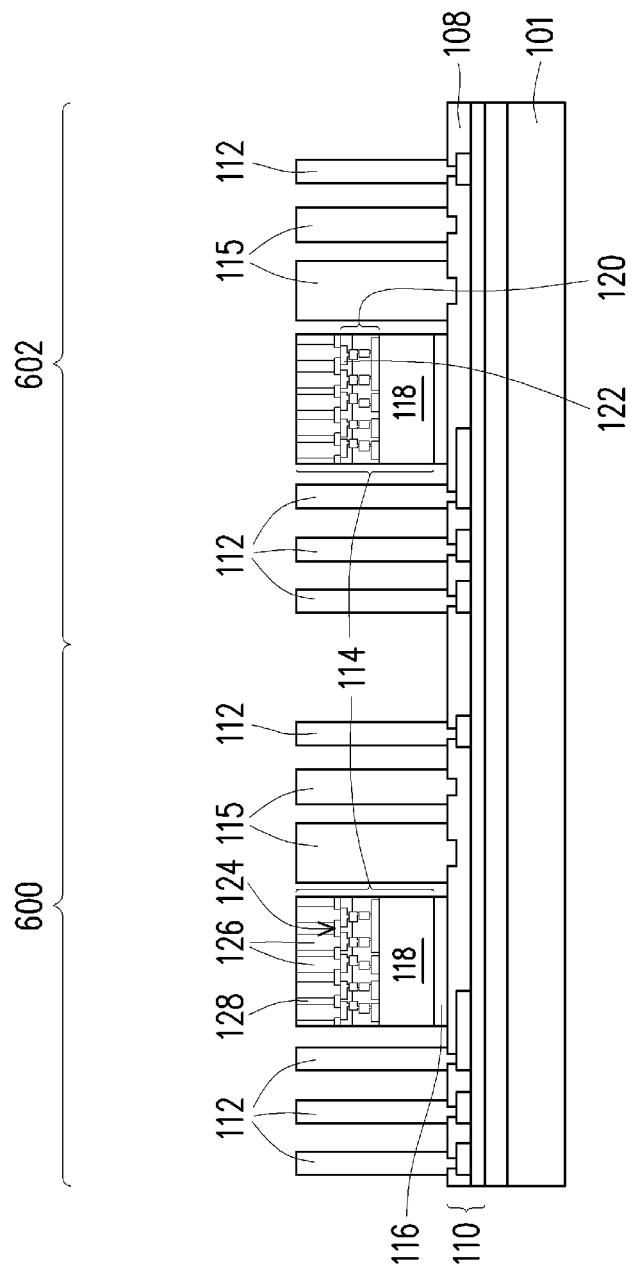
Figure 2P:
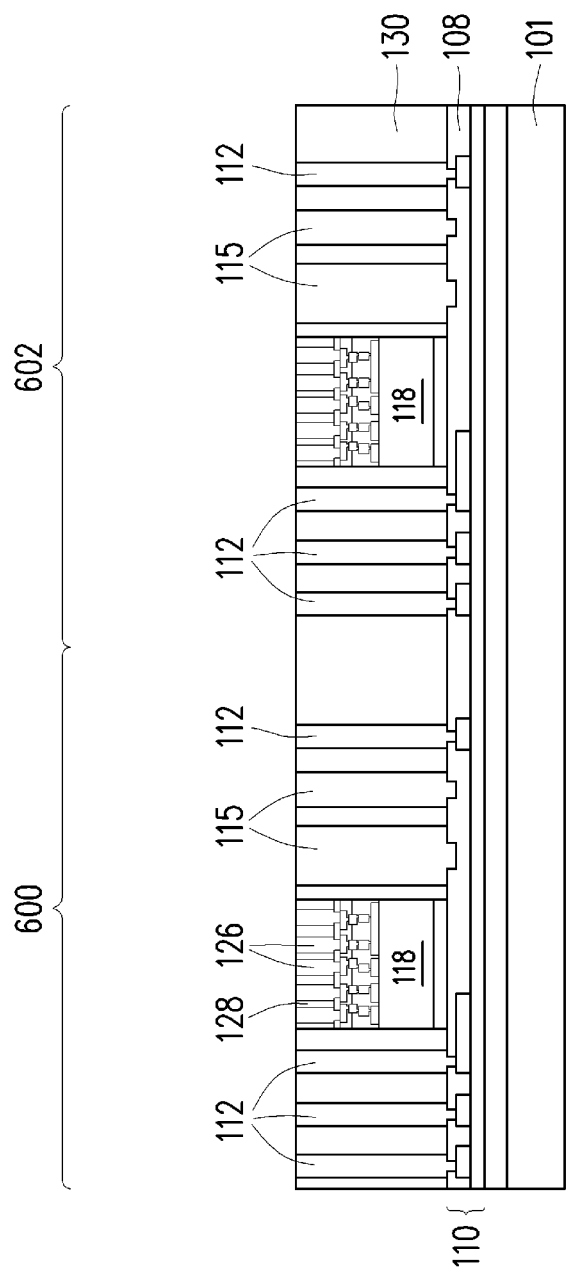
Figure 2Q:
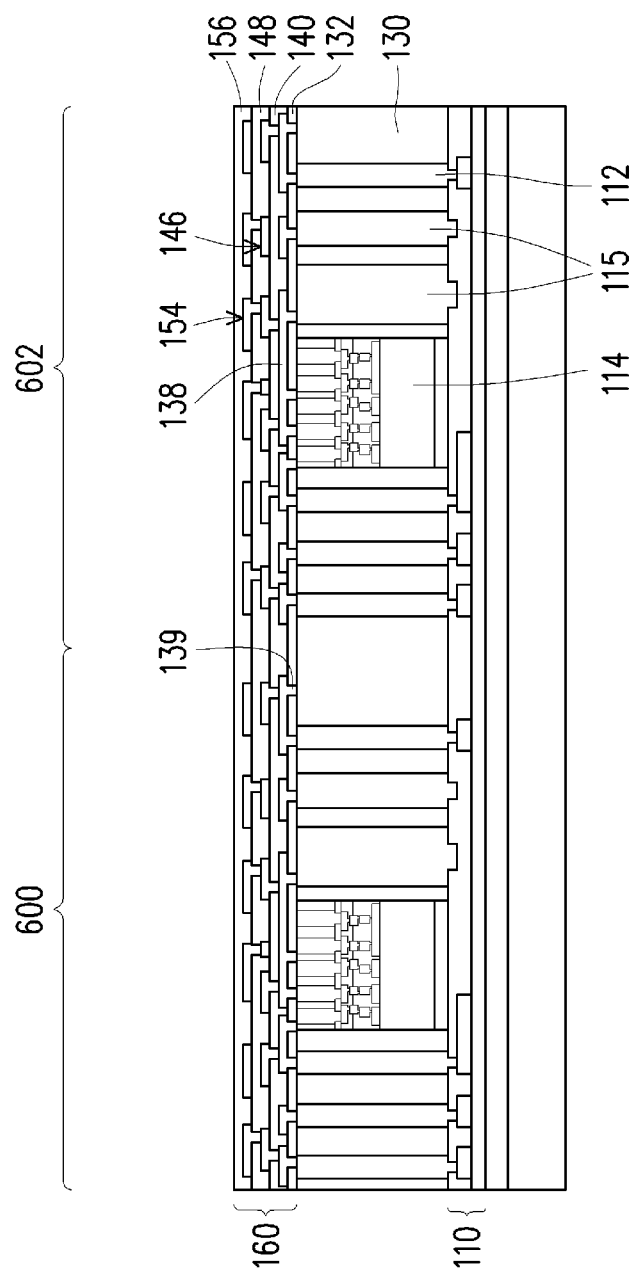
Figure 2R:
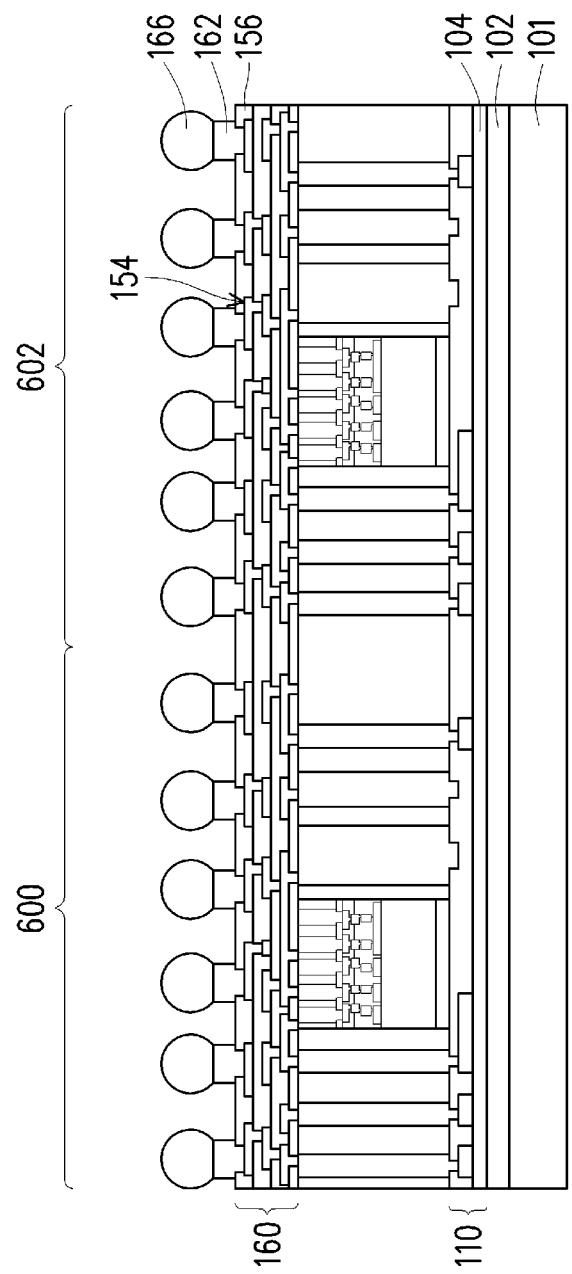
Figure 2S:
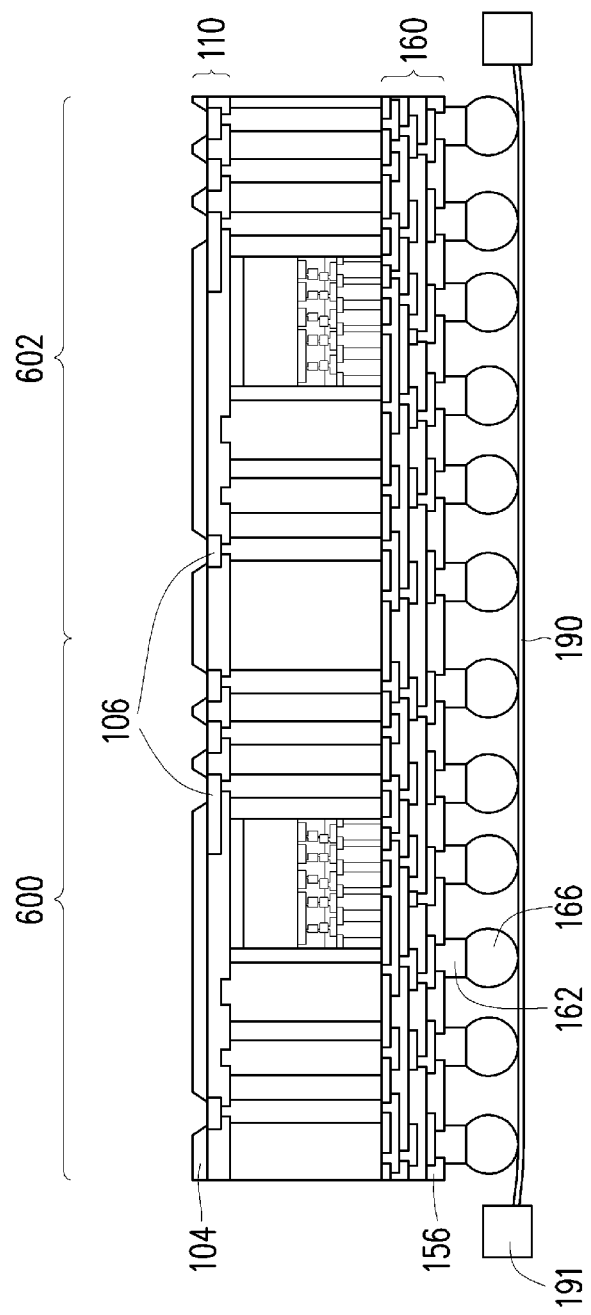
Figure 2T:
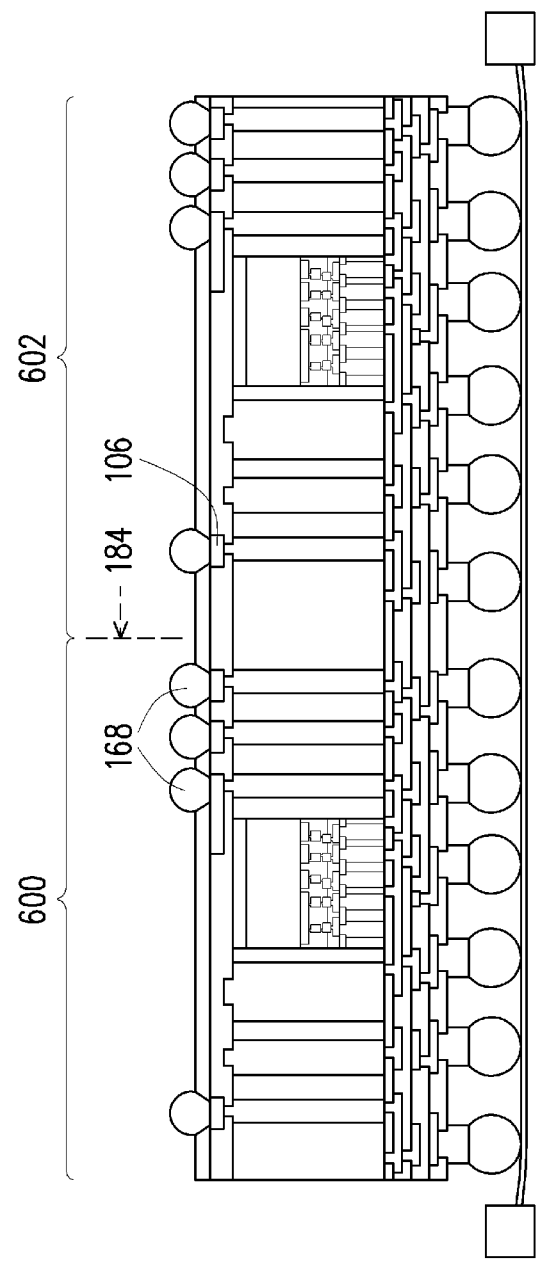
Figure 2D:
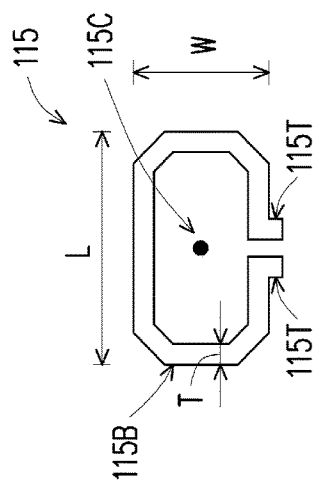
Figure 2E:
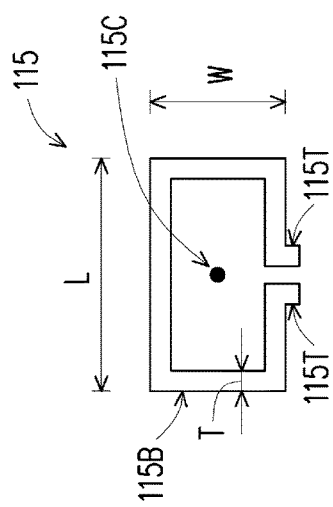
Figure 2F:
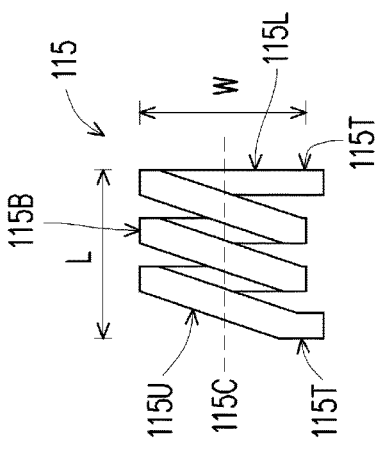
Figure 2G:
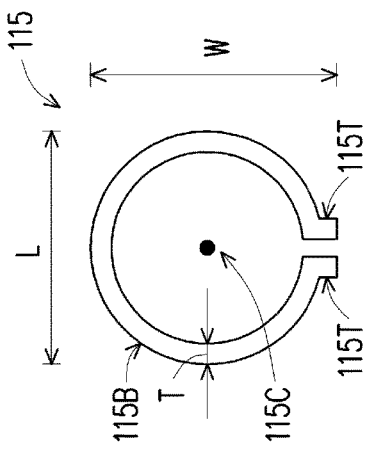

FIGS. 2D-2F illustrate three examples of the cross-sectional view (e.g., top view) of inductor 115 along line D-D in FIG. 2C. In each of the top views of FIGS. 2D-2F, the inductor 115 includes a metal band around an empty space, which will be filled with the molding compound 130 in subsequent processing steps, in some embodiments. In particular, the inductor 115 includes a partially enclosed conductive (e.g., electrically conductive) wall 115B and two terminal portions 115T, with a gap between the two terminal portions 115T. The terminal portions 115T may be electrically coupled to the die 114 through e.g., front-side redistribution layer 160. In the top views of FIGS. 2D-2F, the partially enclosed conductive wall 115B has a shape that includes a major part of a rectangle or square (see FIG. 2D), a major part of an octagon (see FIG. 2E), or a major part of a circle (see FIG. 2F). The conductive wall 115B is partially enclosed since there is a gap between the two terminal portions 115T, and the due to the gap, the top view of the shape of the conductive wall 115B is not a complete shape (e.g., rectangle, square, circle, or octagon), hence only includes a major part of a corresponding shape (e.g., rectangle, square, circle, or octagon). Although the top view of inductor 115 in each of FIGS. 2D-2F only shows one turn of electrically conductive band, inductor 115 may have more than one turns of electrically conductive bands. For example, inductor 115 may have multiple turns of metal bands around center axis 115C, in which case the processing for forming inductors 115 may include forming multiple metal bands disposed at different distances from the upper surface of back-side RDL 110, and connecting each turn of metal band with vias disposed between adjacent turns of metal band. More than one inductor 115 may be formed in each semiconductor package 100. In some embodiments, two or more inductors 115 may be interconnected together (not shown) in series or in parallel to form a multi-phase inductor, e.g., for voltage regulator applications. Skilled artisan will recognize many other suitable shapes for the top view of inductors 115, which are fully intended to be included within the scope of the present disclosure.

In the top views of FIGS. 2D-2F, each inductor 115 has a length L, a width W, and a thickness T. The inductor 115 also has a height H, as illustrated in FIG. 1A. The dimensions (e.g., L, W, T and H) of the inductor 115 may be determined by, e.g., design requirements, size of the package 100 and available space in the molding compound 130. In an embodiment, the height H of the inductor 115 is between about 100 micrometer (μm) to about 300 μm, such as 200 μm. In some embodiments, a length L of the inductor 115 ranges from about 2 millimeter (mm) to about 3 mm, such as 2.2 mm. In some embodiments, a width W of the inductor 115 ranges from about 1 mm to about 2 mm, such as 1.4 mm. In some embodiments, a thickness T of inductor 115 (e.g., thickness of the conductive wall) ranges from about 60 μm to about 150 μm, such as 80 μm. In other embodiments, a thickness from about 200 μm to about 400 μm may be used for the thickness T of inductor 115. Choice of the dimensions of the inductor 115 may affect the resistance and the inductance of the inductor 115. Therefore, the dimensions of the inductor 115 may be adjusted to achieve desired parameters (e.g., inductance values, resistance values, or quality factor) of the inductor 115 in accordance with the design requirements. In accordance with an embodiment of the present disclosure, an inductance of the inductor 115 is between about 1 nanohenry (nH) to about 5 nH at a pre-determined frequency (e.g., 140 MHz), such as about 2 nH. A DC resistance of the inductor 115 is between about 2 milliohm (mΩ) to about 4 mΩ, such as about 3.2 mΩ, in some embodiments. An AC resistance of the inductor 115 at the pre-determined frequency (e.g., 140 MHz) is between about 20 mΩ to about 40 mΩ, such as about 31 mΩ, in some embodiments.

FIG. 2G illustrates another example of the inductor 115 in a top view, which includes a solenoid with conductive band 115B around a center axis 115C, and two terminal portions 115T. While the center axis 115C of the inductors 115 in FIGS. 2D-2F are perpendicular to a major surface of the back-side redistribution layer 110 (shown as a dot since the center axis 115C comes out of the paper in the top view), the center axis 115C of the inductor 115 in FIG. 2G is parallel to the major surface of the back-side redistribution layer 110. The conductive band 115B may include a plurality of upper conductive lines 115U and a plurality of lower conductive lines 115L, with a plurality of vias in between and connecting the upper conductive lines 115U with the corresponding lower conductive lines 115L. The upper conductive lines 115U and the lower conductive lines 115L are substantially parallel to the major surface of back-side redistribution layer 110, with the upper conductive lines 115U being further away from the back-side redistribution layer 110 than the lower conductive lines 115L, in some embodiments. Formation of the inductor 115 in FIG. 2G may involve more processing steps than formation of the inductors 115 in FIGS. 2D-2F. For example, the processing steps described above for forming the vias 112 in FIG. 2C may be repeated, e.g., three times, to successively form the lower conductive lines 115L over the back-side redistribution layer 110, the vias connecting the lower conductive lines 115L and the upper conductive lines 115U, and the upper conductive lines 115U. Skilled artisans will readily envisage the processes and modifications needed for forming the inductor 115 of FIG. 2G based on the discussion above, and details are not discussed here.

Dimensions of the inductor 115 in FIG. 2G may be similar to the dimensions of the inductors 115 in FIGS. 2D-2F, thus are not repeated. In an exemplary embodiment of the present disclosure, an inductor 115 (e.g., a solenoid 115) of FIG. 2G has a length L of about 1.4 mm and a width W of about 1.4 mm, an inductance of about 2.26 nH (e.g., at a frequency of 140 MHz), a DC resistance of about 36.2 mΩ, and an AC resistance of about 108.0 mΩ (e.g., at a frequency of 140 MHz).

Table 1 below lists the dimensions and parameters for a few examples of the inductors 115 in FIGS. 2D-2G. In Table 1, the inductors 115 are distinguished by the top-view shape shown in FIGS. 2D-2G.

TABLE 1

Examples of Inductors 115 Integrated in Semiconductor Packages

| Inductor Shape | Rectangle | Octagon | Circle | Solenoid |
|---|---|---|---|---|
| Form Factor (L × W) (mm) | 1.4 × 2.2 | 1.4 × 2.3 | 2 × 2 | 1.4 × 1.4 |
| Inductance @ 140 MHz (nH) | 2.14 | 2.15 | 2.18 | 2.26 |
| DC Resistance (mΩ) | 3.2 | 3.1 | 3.1 | 36.2 |
| AC Resistance @ 140 MHz | 31.0 | 28.7 | 27.8 | 108.0 |

Figure 7A:
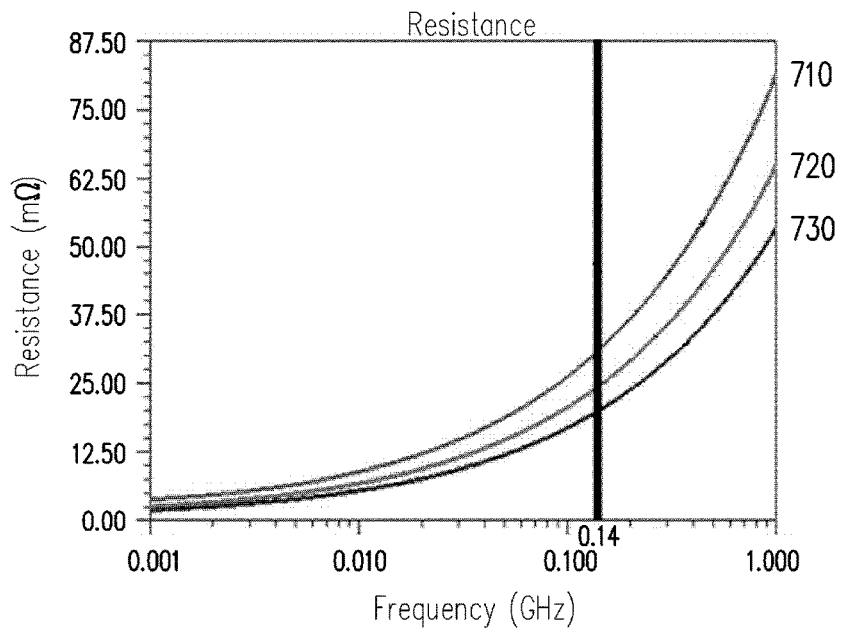
FIG. 7A illustrates examples of the resistance of inductors versus operation frequency, in some embodiments.
Figure 7B:
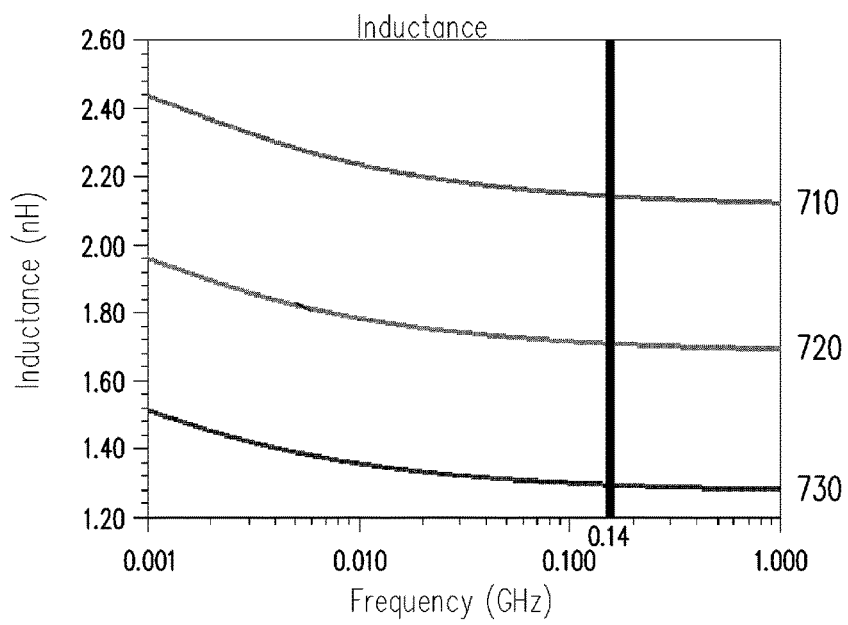
FIG. 7B illustrates examples of the inductance of inductors versus operation frequency, in some embodiments.

FIG. 7A shows the resistance of the rectangular inductor 115 of Table 1 versus the operation frequency. FIG. 7B shows the inductance of the rectangular inductor 115 of Table 1 versus the operation frequency. The results in FIGS. 7A and 7B are simulation results. In each of FIGS. 7A and 7B, three sets of curves corresponding to three different thicknesses T are shown. In particular, curve 710 corresponds to an inductor 115 with a thickness of 200 mΩ, curve 720 corresponds to an inductor 115 with a thickness of 300 mΩ, and curve 730 corresponds to an inductor 115 with a thickness of 400 mΩ. As shown in the example of FIGS. 7A and 7B, within a frequency band of interests (e.g., from about 1 MHz to about 1 GHz), as the frequency increases, the resistance of the inductor 115 increases, and the inductance of the inductor 115 decreases. In addition, a larger thickness T results in a lower resistance of the inductor 115 and a lower inductance of the inductor 115, in various embodiments. Results shown in FIGS. 7A and 7B may be used to determine the dimensions of the inductor 115 in accordance with the design requirements.

FIG. 2H illustrates a cross-section view of package 100 along line C-C of FIG. 1B. As shown in FIG. 2H, antennas 117 are formed. The antennas 117 may be formed at the same time and using the same material as the vias 112, in some embodiments. The same processing steps used for forming vias 112 discussed above may be used to form the antennas 117, with the pattern of the photo resist adjusted to create a desired pattern for the antennas 117 at locations where the antennas 117 are to be formed. In other embodiments, the antennas 117 may be formed using a different process than the process used to form the vias 112, and therefore, may be formed using a different material and/or at a different time than the vias 112.

FIGS. 2I-2M illustrate five examples of the cross-sectional view (e.g., top view) of antenna 117 along line E-E in FIG. 2H. In each of the top views of FIGS. 2I-2M, the antenna 117 includes two conductive walls 117A and 117B closely spaced apart with a gap in between, and two terminal portions 117T. The terminal portions 117T may be electrically coupled to the die 114 through e.g., the front-side redistribution layer 160, although other conductive paths, such as the back-side redistribution layer 110, may also be used to electrically couple the antenna 117 with the die 114. After the molding compound 130 is formed in subsequent processing, the antenna 117 is surrounded by molding compound 130, and the two conductive walls 117A and 117B are separated by molding compound 130 (see, e.g., FIG. 1B).

As illustrated in FIGS. 2I-2M, each of the two conductive walls 117A/117B (also referred to as conductive bands 117A/117B) includes two or more segments that intersect. For example, each of the conductive walls 117A/117B in FIG. 2I includes two segments that intersect to form an L-shape in the top view. In FIG. 2J, the two segments of the conductive wall (e.g., 117A or 117B) form an L-shape with a beveled edge at the outer perimeter of the intersection of the two segments. In FIG. 2K, the two segments of the conductive wall (e.g., 117A or 117B) form a V-shape with an obtuse angle θ. In FIG. 2L, each of the conductive walls (e.g., 117A and 117B) has more than two segments that intersect. In the example of FIGS. 2I-2L, the two conductive walls are symmetric. In the example of FIG. 2M, the two conductive walls are non-symmetric, with a first conductive wall 117B having an L-shape, and a second conductive wall 117A having more than two segments that intersect. Skilled artisan will recognize other suitable shapes for the antenna 117, which are fully intended to be included within the scope of the present disclosure. In addition, skilled artisans will appreciate that the dimensions of the antenna 117 may be adjusted according to, for example, design requirements (e.g., operation frequency of the antenna 117), and the size of the semiconductor package.

FIG. 2N illustrates a perspective view of an antenna 117, in accordance with an exemplary embodiment of the present disclosure. The antenna 117 shown in FIG. 2N may be a dipole antenna having two conductive bands 117A and 117B that are symmetric. Each conductive band 117A or 117B includes two segments that form an L-shape, with a first length $L_{antenna}$ for a first segment and a second length $L_{match}$ for a second segment of the conductive band. The second segment (e.g., the segment with length $L_{match}$) of conductive band 117B is parallel and closely spaced apart from the second segment (e.g., the segment with length $L_{match}$) of conductive bands 117A, with a gap there between having a gap distance of $S_{gap}$. Each of the two conductive bands 117A and 117B has a thickness T and a height H, as illustrated in FIG. 2N.

Dimensions of the dipole antenna 117 of FIG. 2N are chosen in accordance with the wavelength λ of the electromagnetic signal the dipole antenna 117 is configured to transmit and/or receive, in some embodiments. For example, the first length $L_{antenna}$ may be chosen to be about a quarter of the wavelength λ (e.g., $L_{antenna}$=λ/4) at an operation frequency f, where the wavelength λ and the operation frequency f are related by f*λ=c, where C is the speed of light. In addition, the second length $L_{match}$ and gap distance $S_{gap}$ may be tuned to match the first length $L_{antenna}$ to optimize or enhance the performance of dipole antenna 117. For example, dimensions of $L_{match}$ and $S_{gap}$ may affect the parasitic inductance and capacitance of the feeding port, thus affecting the impedance matching of the antenna (e.g., the dipole antenna 117), which in turn may affect antenna gain and efficiency. In an embodiment where the dipole antenna 117 is designed to be used for an operation frequency in a range from about 50 GHz to about 80 GHz (e.g., 60 GHz), the first length $L_{antenna}$ is in a range between about 500 μm to about 800 μm (e.g., 750 μm), the second length $L_{match}$ is in a range between 550 μm to about 700 μm (e.g., 650 μm), gap distance $S_{gap}$ is between about 50 μm to about 200 μm (e.g., 150 μm), height H is between about 100 μm to about 220 μm (e.g., 200 μm), and thickness T is between about 80 μm to about 150 μm (e.g., 150 μm). In the above example, an antenna gain of about 4.16 dBi and an antenna radiation efficiency of about 94.8% have been achieved for the dipole antenna 117.

In FIG. 2O, integrated circuit dies 114 are adhered to the dielectric layer 108 by an adhesive 116. As illustrated in FIG. 2O, an integrated circuit dies 114 are adhered in each of the first package region 600 and the second package region 602, and in other embodiments, more integrated circuit dies 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), bio chip, energy harvesting chip, the like, or a combination thereof.

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, gallium nitride, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating, or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 101. The integrated circuit dies 114 may be singulated, such as by sawing or dicing, and adhered to the dielectric layer 108 by the adhesive 116 using, for example, a pick-and-place tool.

In FIG. 2P, an encapsulant 130 is formed on the various components. The encapsulant 130 may be a molding compound, epoxy, or the like, and may be applied by compression molding, transfer molding, or the like. The encapsulant 130 may also be referred to as molding compound 130 in the present disclosure, with the understanding that encapsulant 130 may include any suitable molding material. After curing, the encapsulant 130 may undergo a grinding process to expose the vias 112 and die connectors 126. Top surfaces of the vias 112, die connectors 126, and encapsulant 130 are coplanar after the grinding process. In some embodiments, the grinding may be omitted, for example, if vias 112 and die connectors 126 are already exposed.

In FIG. 2Q, a front-side redistribution layer (RDL) 160 is formed over the dies 114, vias 112, inductors 115, antennas 117 (not shown), and the molding compound 130, in some embodiments. The front-side RDL 160 may include one or more dielectric layers (e.g., dielectric layers 132/140/148/156), and a plurality of metallization patterns, such as conductive metal lines (e.g., 138/146/154) and/or conductive metal vias (e.g., 139) formed inside the one or more dielectric layers. The dielectric layers (e.g., dielectric layers 132/140/148/156) may be formed, for example, of a low dielectric constant (low-K) dielectric material, phosphosilicate glass (PSG), borophosphosilicate glass (BPSG), fluorinated silicate glass (FSG), $SiO_xC_y$, spin-on-glass, spin-on-polymers, silicon carbon material, compounds thereof, composites thereof, combinations thereof, or the like, by any suitable method, such as spinning, CVD, and/or plasma-enhanced CVD (PECVD). The conductive lines (e.g., 138/146/154) and conductive vias (e.g., 139) of the front-side RDL 160 may comprise copper, copper alloys, other metals or alloys, or combinations or multiple layers thereof, as examples, and may be formed using subtractive and/or damascene techniques, as examples. The metallization patterns may be formed using one or more of sputtering processes, photolithography processes, plating processes, and photoresist strip processes, as examples. The front-side redistribution structure 160 is shown as an example. More or fewer dielectric layers and metallization patterns may be formed in the front-side redistribution structure 160, as one having ordinary skill in the art will readily appreciate.

In FIG. 2R, pads 162 are formed on an exterior side of the front-side redistribution structure 160. The pads 162 are used to couple to conductive connectors 166 and may be referred to as under bump metallurgies (UBMs) 162. In the illustrated embodiment, the pads 162 are formed through openings through the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162. In the embodiment, where the pads 162 are formed differently, more photo resist and patterning steps may be utilized.

Also in FIG. 2R, conductive connectors 166 are formed on the UBMs 162. The conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

In FIG. 2S, the structure shown in FIG. 2R is flipped over and attached to a tape 190 (e.g., a dicing tape 190) supported by a frame 191, and carrier substrate de-bonding is performed to detach (de-bond) the carrier substrate 101 from the back-side redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 101 can be removed.

As further illustrated in FIG. 2S, openings are formed through the dielectric layer 104 to expose portions of the metallization pattern 106. The openings may be formed, for example, using laser drilling, etching, or the like.

Next, as illustrated in FIG. 2T, conductive connectors 168 are formed and attached to the exposed portions of the metallization pattern 106. Materials and formation methods for the conductive connectors 168 may be similar to that of conductive connectors 166 discussed above with reference to FIG. 2R, thus details are not repeated here. In other embodiments, conductive connectors 168 may be omitted.

In FIG. 2T, a singulation process is performed by dicing along scribe line regions e.g., between adjacent regions 600 and 602, such as along line 184. Dicing saw or laser cutting may be used, in various embodiments. The singulation process separates the first package region 600 from the second package region 602, and a plurality of semiconductor packages 100, such as the semiconductor package illustrated in FIG. 1A, is formed, in some embodiments.

By integrating antennas and inductors in the molding compound 130 of semiconductor package 100, higher integration density and smaller form factor are achieved for semiconductor packages. The disclosed integrated antennas and integrated inductors obviate the need for surface mount device (SMD) inductors or SMD antennas, which require a substrate and large areas on the substrate for mounting. In addition, since the antenna 117 and inductor 115 are located next to the dies 114, a short electrical path to the die 114 can be achieved, which reduces antennas transmission loss and enhances antenna performance. For example, a conventional SMD antenna may have a transmission loss of about 1.6 dB, and the disclose antenna 117 may reduce the transmission loss to about 0.7 dB, thus achieving about 0.9 dB improvement.

Figure 3A:
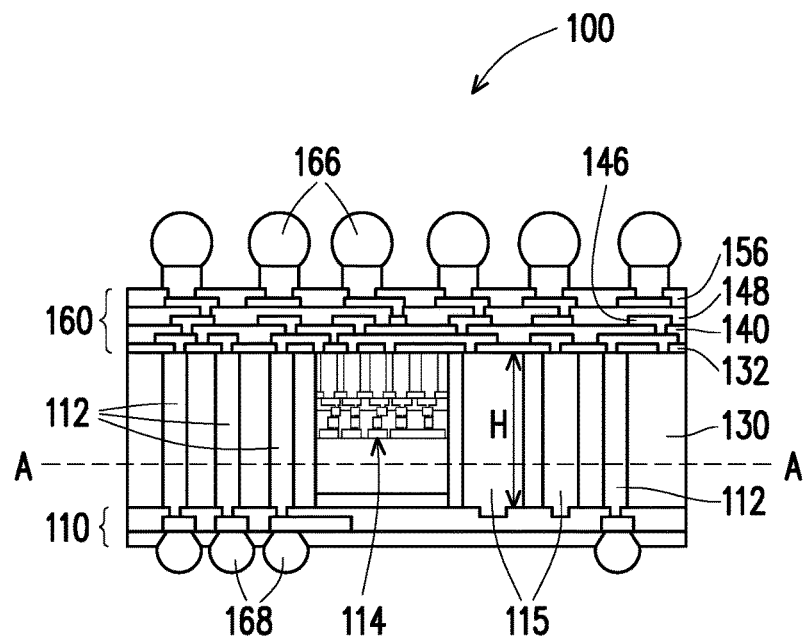
FIGS. 3A through 3C illustrate cross-sectional views of another semiconductor package, in accordance with some embodiments.
Figure 3B:
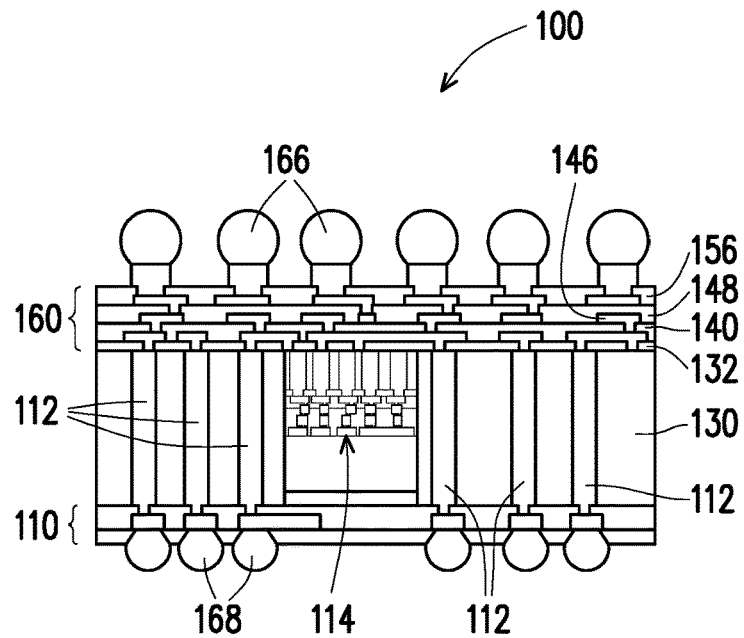
Figure 3C:
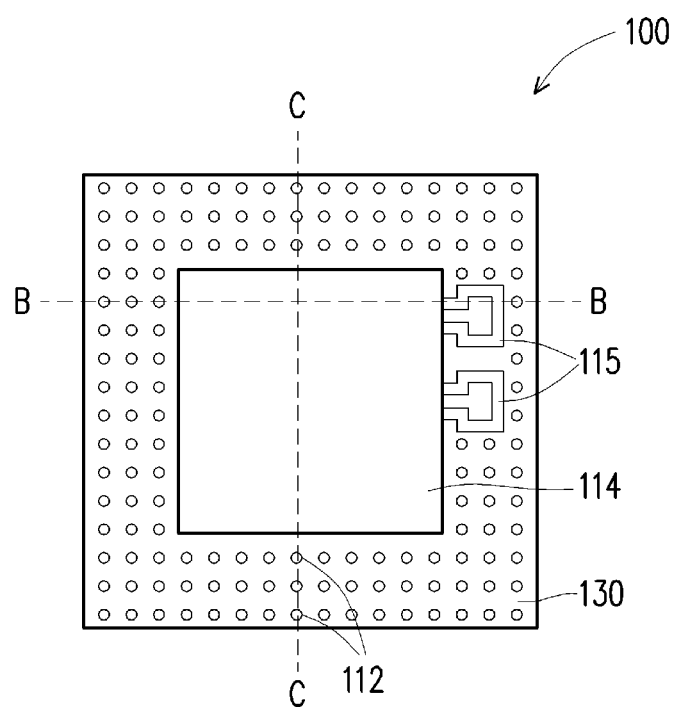

FIGS. 3A-3C illustrate cross-sectional views of a semiconductor package 100 for another embodiment of the present disclose, where semiconductor package 100 include inductors 115, but do not include antennas 117 (see FIG. 3C). FIGS. 3A-3C are similar to FIGS. 1A-1C, with similar reference numbers representing similar components. In particular, FIG. 3A is a cross-sectional view of package 100 along line B-B of FIG. 3C, FIG. 3B is a cross-sectional view of package 100 along line C-C of FIG. 3C, and FIG. 3C is a cross-sectional view (e.g., a top view) of package 100 along line A-A of FIG. 3A. Although FIG. 3C illustrates two inductors 115 embedded in molding compound 130, more or less than two inductors 115 may be formed in semiconductor package 100. The processing steps to form the package 100 illustrated in FIGS. 3A-3C may be similar to processing steps illustrated in FIGS. 2A-2T, and skilled artisans will readily appreciate the modifications needed to fabricate the package 100 in FIGS. 3A-3C.

Figure 4A:
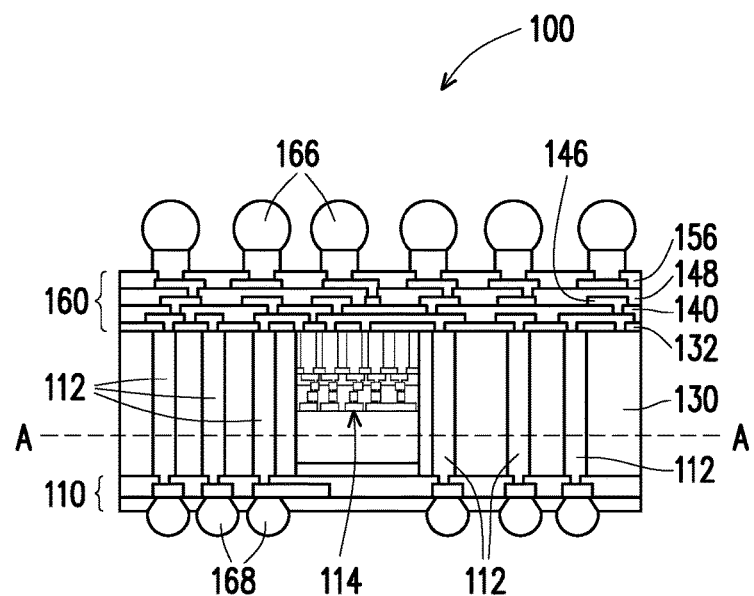
FIGS. 4A through 4C illustrate cross-sectional views of another semiconductor package, in accordance with some embodiments.
Figure 4B:
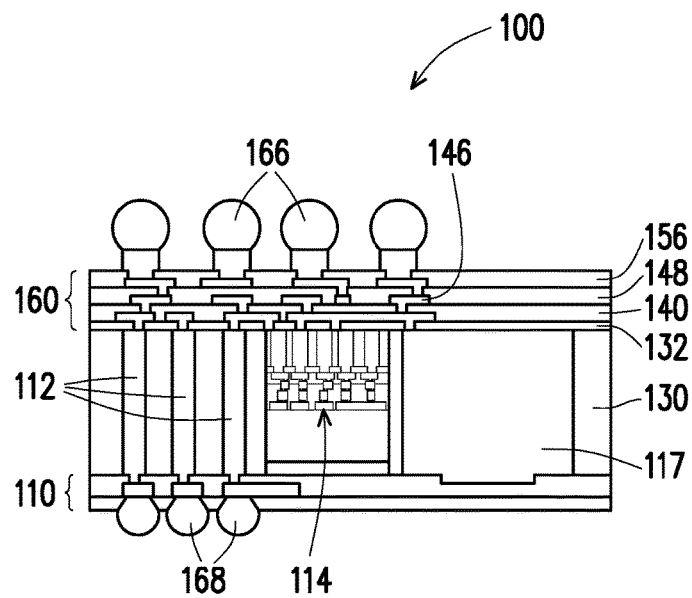
Figure 4C:
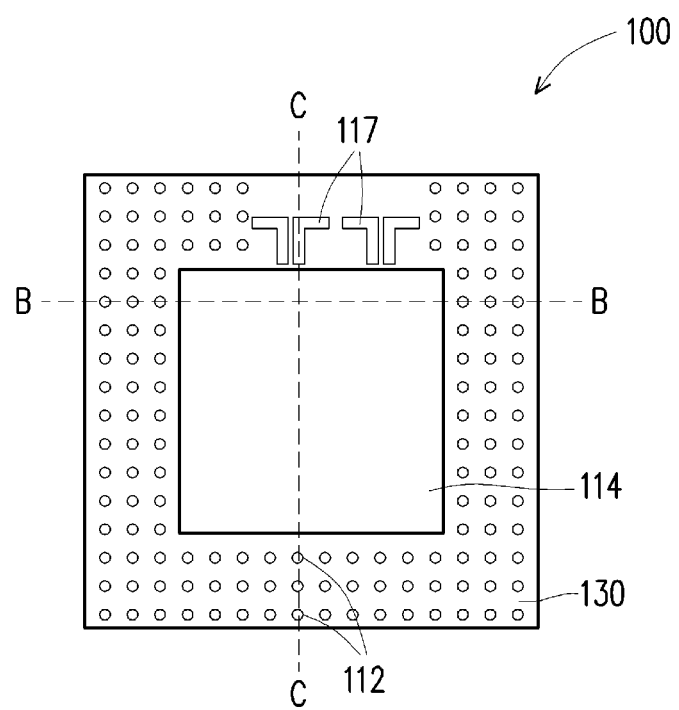

FIGS. 4A-4C illustrate cross-sectional views of a semiconductor package 100 for another embodiment of the present disclose, where semiconductor package 100 include antennas 117, but do not include inductors 115 (see FIG. 4C). FIGS. 4A-4C are similar to FIGS. 1A-1C, with similar reference numbers representing similar components. In particular, FIG. 4A is a cross-sectional view of package 100 along line B-B of FIG. 4C, FIG. 4B is a cross-sectional view of package 100 along line C-C of FIG. 4C, and FIG. 4C is a cross-sectional view (e.g., a top view) of package 100 along line A-A of FIG. 4A. Although FIG. 4C illustrates two antennas 117 embedded in molding compound 130, more or less than two antennas 117 may be formed in semiconductor package 100. The processing steps to form the package 100 illustrated in FIGS. 4A-4C may be similar to processing steps illustrated in FIGS. 2A-2T, and skilled artisans will readily appreciate the modifications needed to fabricate the package 100 in FIGS. 4A-4C.

Figure 5A:
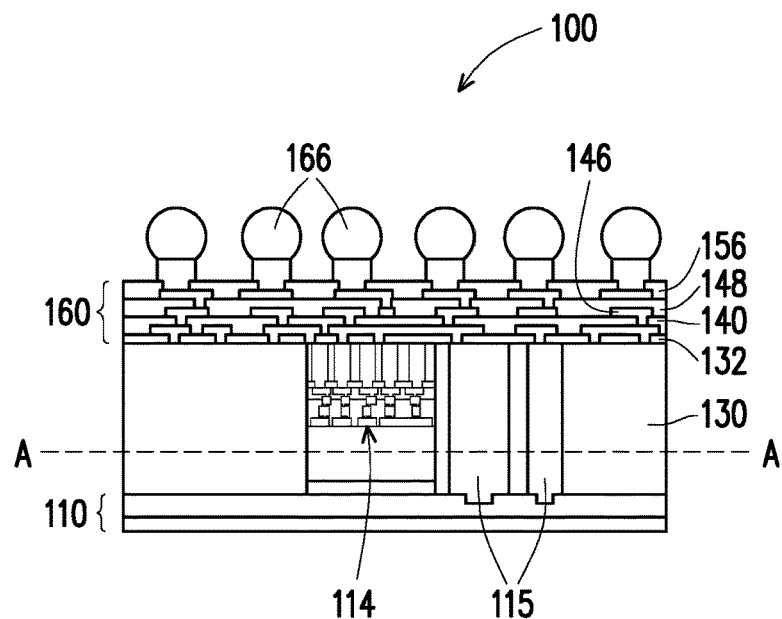
FIGS. 5A through 5C illustrate cross-sectional views of yet another semiconductor package, in accordance with some embodiments.
Figure 5B:
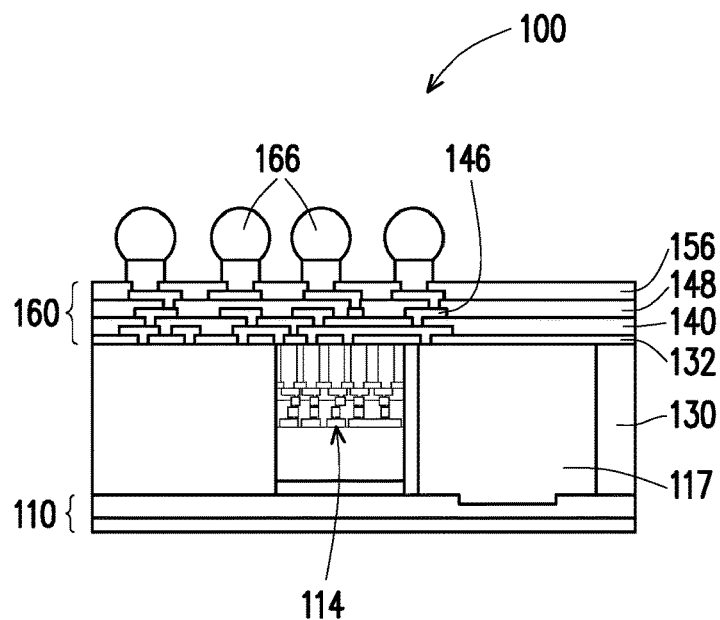
Figure 5C:
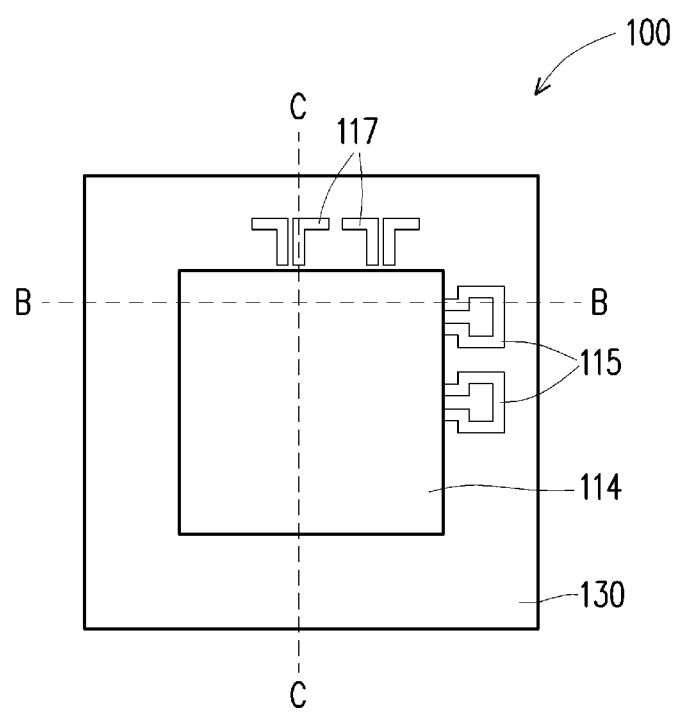

FIGS. 5A-5C illustrate cross-sectional views of a semiconductor package 100 for yet another embodiment of the present disclose, where semiconductor package 100 include antennas 117 and inductors 115, but do not include vias 112 (see FIG. 5C). FIGS. 5A-5C are similar to FIGS. 1A-1C, with similar reference numbers representing similar components. In particular, FIG. 5A is a cross-sectional view of package 100 along line B-B of FIG. 5C, FIG. 5B is a cross-sectional view of package 100 along line C-C of FIG. 5C, and FIG. 5C is a cross-sectional view (e.g., a top view) of package 100 along line A-A of FIG. 5A. Although FIG. 5C illustrates two antennas 117 and two inductors 115 embedded in molding compound 130, more or less than two antennas 117 and more or less than two inductors 115 may be formed in semiconductor package 100. The processing steps to form the package 100 illustrated in FIGS. 5A-5C may be similar to processing steps illustrated in FIGS. 2A-2T, and skilled artisans will readily appreciate the modifications needed to fabricate the package 100 in FIGS. 5A-5C.

Figure 6:
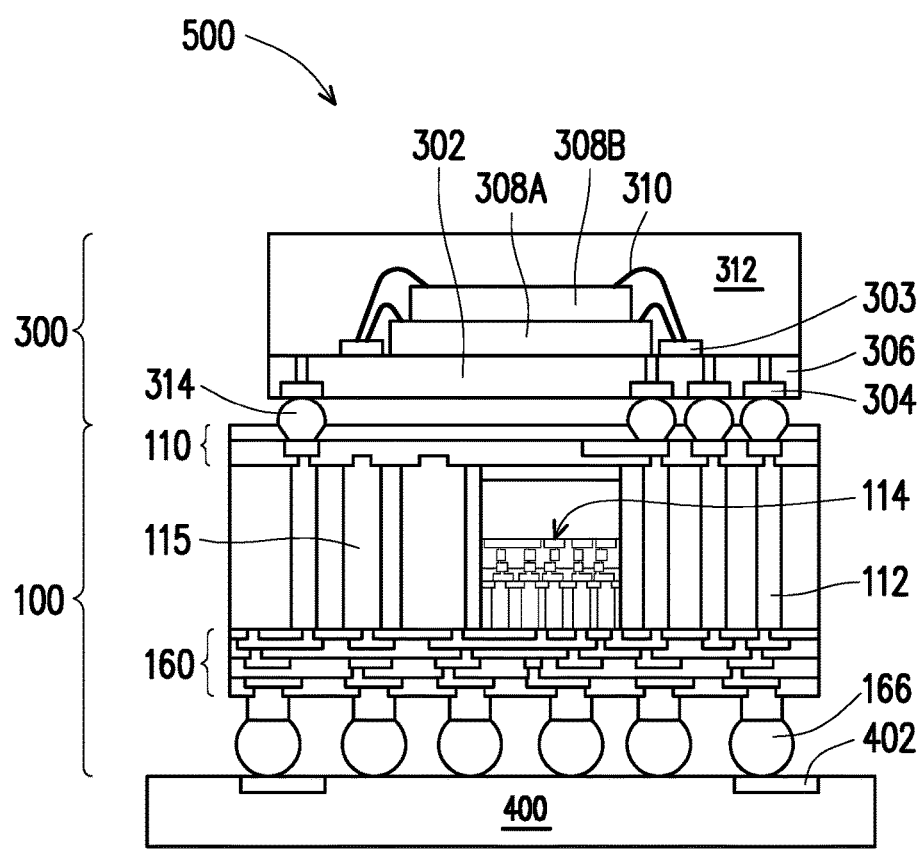
FIG. 6 illustrate cross-sectional views of a package-on-package (PoP) structure, in accordance with some embodiments.

FIG. 6 illustrates a package structure 500 including the package 100 (may be referred to as a first package 100), a second package 300, and a substrate 400. The package 100 may be any of the package 100 described above. The second package 300 includes a substrate 302 and one or more stacked dies 308 (308A and 308B) coupled to bond pads 303 on a first side of the substrate 302 via, e.g., bond wires 310. Electrically conductive features may be formed in the substrate 302, and may electrically couple bond pads 303 on the first side of substrate 302 to bond pads 304 on a second side of substrate 302. The stacked dies 308 are encapsulated in molding compound 312. Bond pads 304 on the second side of substrate 302 of the second package 300 are physically and electrically coupled to the first package 100 via inter-package connectors 314. FIG. 6 also illustrates a substrate 400, which may be referred to a package substrate 400. The package 200 is mounted to the package substrate 400 using the conductive connectors 166, in some embodiments.

In accordance with some embodiments, inductors 115 and/or antennas 117 (not shown) of the first package 100 are electrically coupled to the second package 300 through the inter-package connectors 314, thus is accessible by the second package 300. The inductors 115 and/or the antennas 117 may be electrically coupled to inter-package connectors 314 through the front-side redistribution layer 160, vias 112, and back-side redistribution layer 110, as an example. As a result, an RF module of the second package 300 may be electrically coupled to one or more antennas 117 of the first package 100, thus the second package 300 is able to transmit and/or receive electromagnetic signals using antennas 117 of the first package 100. As another example, a circuit (e.g., an oscillator circuit, a voltage regular circuit) of the second package 300 may be electrically coupled to one or more inductors 115 of the first package 100 via inter-package connectors 314, thus able to use the inductors 115 of the first package 100 for operation of the second package 300. The ability to share the integrated inductors 115 and antennas 117 with another package illustrates another advantage of the present disclosure.

Figure 8:
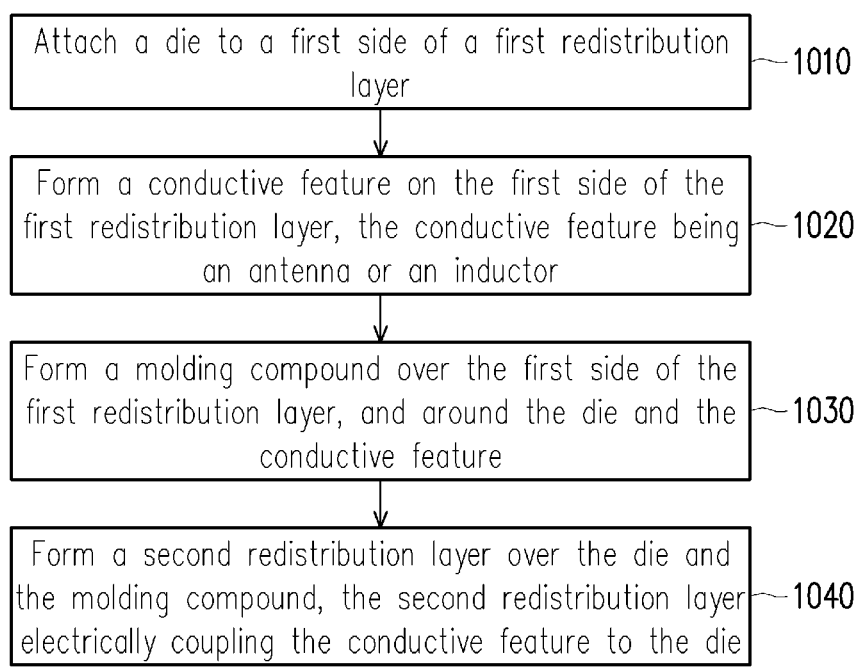
FIG. 8 illustrates a flow diagram of method of forming a semiconductor package, in accordance with some embodiments.

FIG. 8 illustrates a flow chart of a method of fabricating a semiconductor structure, in accordance with some embodiments. It should be understood that the embodiment method shown in FIG. 8 is an example of many possible embodiment methods. One of ordinary skill in the art would recognize many variations, alternatives, and modifications. For example, various steps as illustrated in FIG. 8 may be added, removed, replaced, rearranged and repeated.

As illustrated in FIG. 8, at step 1010, a die is attached to a first side of a first redistribution layer. At step 1020, a conductive feature is formed on the first side of the first redistribution layer, the conductive feature being an antenna or an inductor. At step 1030, a molding compound is formed over the first side of the first redistribution layer, and around the die and the conductive feature. At step 1040, a second redistribution layer is formed over the die and the molding compound, the second redistribution layer electrically coupling the conductive feature to the die.

Embodiments of the device and methods in the current disclosure have many advantages. In particular, by integrating antennas and/or inductors in the molding compound of a semiconductor package, higher integration density and smaller form factors are achieved. The disclosed antennas and inductors may replace existing SMD antennas and SMD inductors, thus may not need a substrate or the large substrate surface areas for mounting the SMD inductors and SMD antennas. Due to the shorter electrical connection between the disclosed integrated antennas and the die, antennas transmission loss is reduced and antenna performance is improved.

In some embodiments, a semiconductor package includes a die surrounded by a molding material, a redistribution layer over the die and the molding material, the redistribution layer electrically coupled to the die, and a first conductive structure in the molding material and electrically coupled to the die, the first conductive structure being an inductor or an antenna.

In other embodiments, a semiconductor package includes a first dielectric layer, a die attached to a first side of the first dielectric layer, and a molding compound around the die and over the first side of the first dielectric layer. The semiconductor package further includes a first redistribution layer over the die and the molding compound, the first redistribution layer electrically coupled to the die, and a first conductive feature in the molding compound and between the first dielectric layer and the first redistribution layer, the first conductive feature being an antenna or an inductor electrically coupled to the die.

In yet another embodiment, a method of forming a semiconductor package includes attaching a die to a first side of a first redistribution layer, forming a conductive feature on the first side of the first redistribution layer, the conductive feature being an antenna or an inductor, and forming a molding compound over the first side of the first redistribution layer, and around the die and the conductive feature. The method further includes forming a second redistribution layer over the die and the molding compound, the second redistribution layer electrically coupling the conductive feature to the die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package comprising:
a die surrounded by a molding material;
a redistribution layer over the die and the molding material, the redistribution layer electrically coupled to the die, and at least a portion of the redistribution layer contacting at least a portion of a top surface of the molding material;
an inductor, wherein a least a portion of the inductor is in the molding material; and
a first conductive structure in the molding material and electrically coupled to the die, the first conductive structure comprising an antenna, wherein at least a portion of a top surface of the antenna, at least a portion of the top surface of the molding material, and at least a portion of a top surface of the die are level with one another, and wherein the antenna comprises two conductive walls spaced apart with the molding material in between.

2. The semiconductor package of claim 1, wherein the first conductive structure is electrically coupled to the die via the redistribution layer.

3. The semiconductor package of claim 1, wherein each of the two conductive walls comprises at least two segments that intersect.

4. The semiconductor package of claim 1, wherein the antenna is configured to receive an electromagnetic signal within a pre-determined frequency range.

5. The semiconductor package of claim 4, wherein the antenna is electrically coupled to an RF circuit of the die.

6. The semiconductor package of claim 2, wherein the inductor comprises a metal band around a portion of the molding material.

7. The semiconductor package of claim 6, wherein the antenna is in the molding material and electrically coupled to the die, the antenna comprising two conductive walls with the molding material in between, the antenna configured to receive an electromagnetic signal within a pre-determined frequency range.

8. The semiconductor package of claim 6, wherein the inductor comprises a partially enclosed conductive wall.

9. The semiconductor package of claim 6, wherein the inductor comprises a solenoid, and wherein a center axis of the solenoid is substantially parallel to a major surface of the redistribution layer.

10. The semiconductor package of claim 2, further comprising an external connector over and electrically coupled to the redistribution layer.

11. The semiconductor package of claim 10, wherein the first conductive structure is electrically coupled to the external connector.

12. The semiconductor package of claim 1, wherein the top surface of the antenna and the top surface of the die are substantially flat.

13. The semiconductor package of claim 1, wherein at least one of the two conductive walls comprises at least two segments that intersect at an acute, right, or obtuse angle.

14. The semiconductor package of claim 13, wherein the at least two segments intersect at the acute, right, or obtuse angle from a top view of a surface parallel to the top surface of the die.

15. A semiconductor package comprising:
a first dielectric layer;
a die attached to a first side of the first dielectric layer;
a molding compound around the die and over the first side of the first dielectric layer;
a first redistribution layer over the die and the molding compound, the first redistribution layer electrically coupled to the die; and a first conductive feature in the molding compound and between the first dielectric layer and the first redistribution layer, the first conductive feature comprising an antenna electrically coupled to the die, wherein the antenna comprises two non-overlapping metal walls in a top view, the two non-overlapping metal walls separated by a portion of the molding compound that extends between and contacts side surfaces of the two non-overlapping metal walls.

16. The semiconductor package of claim 15, further comprising an inductor, wherein the inductor comprises a metal band surrounding a portion of the molding compound.

17. The semiconductor package of claim 16, wherein inductor has an inductance between about 1 nanohenry (nH) to about 5 nH.

18. The semiconductor package of claim 15, wherein the antenna is coupled to an RF module of the die.

19. A method of forming a semiconductor package comprising:
attaching a die to a first side of a first redistribution layer;
forming a conductive feature on the first side of the first redistribution layer, the conductive feature comprising an antenna;
forming a molding compound over the first side of the first redistribution layer, and around the die and the conductive feature; and
forming a second redistribution layer over the die and the molding compound, the second redistribution layer electrically coupling the conductive feature to the die, wherein the second redistribution layer comprises a via extending through a dielectric layer, and at least a portion of a first interface between the dielectric layer and the antenna and at least a portion of a second interface between the via and the antenna intersect a same plane parallel to a major plane of the molding compound.

20. The method of claim 19, wherein the forming the conductive feature comprises forming two conductive walls over the first side of the first redistribution layer, the two conductive walls having a gap in between.

21. The method of claim 19, wherein the forming the conductive feature comprises forming a partially enclosed conductive wall over the first side of the first redistribution layer.

* * * * *